United States Patent [19]

Douglas

[11] Patent Number: 4,855,015

[45] Date of Patent: Aug. 8, 1989

[54] DRY ETCH PROCESS FOR SELECTIVELY ETCHING NON-HOMOGENEOUS MATERIAL BILAYERS

[75] Inventor: Monte A. Douglas, Coppell, Tex.

[73] Assignee: Texas Instruments Incorporated, Dallas, Tex.

[21] Appl. No.: 187,679

[22] Filed: Apr. 29, 1988

[51] Int. Cl.⁴ .................. H01L 21/306; B44C 1/22; C03C 15/00; C03C 25/06

[52] U.S. Cl. ................... 156/626; 156/643; 156/646; 156/652; 156/655; 156/657; 156/659.1; 156/662; 204/192.33; 204/192.35; 204/192.37; 252/79.1; 437/228

[58] Field of Search ............ 427/38, 39; 156/626, 156/643, 646, 652, 653, 655, 657, 659.1, 662; 252/79.1; 204/192.32, 192.33, 192.35, 192.37; 437/225, 228, 233

[56] References Cited

U.S. PATENT DOCUMENTS 4,374,698  2/1983  Sanders et al. .............. 156/646 X
4,465,552  8/1984  Bobbio et al. ................. 156/643
4,668,337  5/1987  Sekine ......................... 156/643

Primary Examiner—William A. Powell
Attorney, Agent, or Firm—Larry C. Schroeder; Rodney M. Anderson; Melvin Sharp

[57] ABSTRACT

A plasma etching process employs a halogen liberating gas to selectively etch a top semiconductor layer of a bilayer with respect to a bottom semiconductor layer. A fluorine rich gas reacts with a top germanium layer for removal thereof, while forming a passivating surface layer on a bottom silicon layer to inhibit the silicon' plasma reaction therewith.

41 Claims, 2 Drawing Sheets

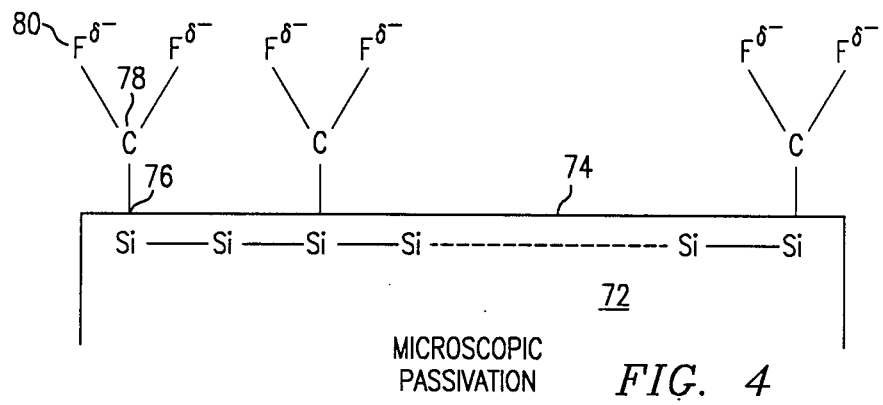
MICROSCOPIC PASSIVATION    *FIG. 4*
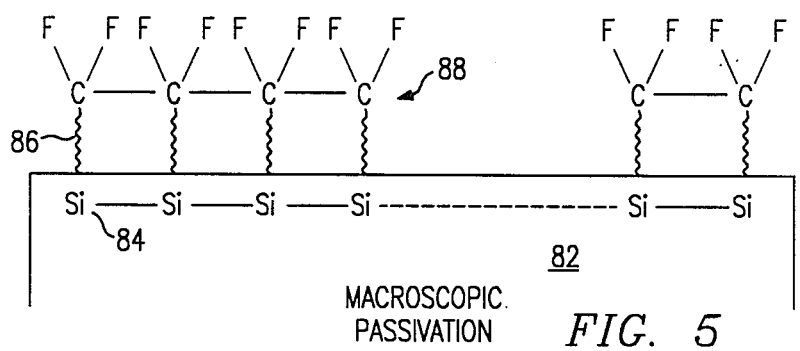
MACROSCOPIC PASSIVATION    *FIG. 5*

DRY ETCH PROCESS FOR SELECTIVELY ETCHING NON-HOMOGENEOUS MATERIAL BILAYERS

RELATED APPLICATION

"Method For Improving Manufacturability of Polysilicon Self-Aligned Bipolar Transistors", by Verret et al., Ser. No. 188,240, filed concurrently herewith, on 29 Apr. 1988.

TECHNICAL FIELD OF THE INVENTION

The present invention relates in general to procedures and techniques for etching materials utilized in the semiconductor technology, and more particularly relates to dry or plasma etching techniques for selectively etching one material with respect to another material.

BACKGROUND OF THE INVENTION

Many semiconductor fabrication processes currently employ polycrystalline silicon (polysilicon) as a material for conductor interconnection purposes. This is due primarily to the ease with which polysilicon can be processed in semiconductor manufacturing, its low cost, as well as its ability to be highly doped to provide a low resistance conductor. In addition, the base or starting material of many semiconductor circuits comprises a single crystal silicon wafer with which the polysilicon is compatible for fabricating the circuits.

Typically, a doped polysilicon is deposited over a processed single crystal silicon semiconductor as a first step in forming a conductor for connecting one semiconductor region to another. The wafer is then masked and patterned to define the particular geometry of the conductor. An etch process, generally a plasma or dry etch, is employed to remove the undesired portions of the polysilicon material. One problem encountered in the polysilicon etching process is the inability to easily detect when the polysilicon has been removed down to its interface with the underlying single crystal silicon material. In fabricating certain integrated circuits, it is highly desirable to stop the etch process when the polysilicon material has been completely removed, such that the single crystal material is not exposed to the etch for a substantial period of time.

The foregoing desirability is particularly important in fabricating vertical bipolar transistor devices, in which the polysilicon material is patterned and etched to define an emitter opening therein. The etch extends down to the single crystal silicon material in which the active bipolar transistor regions are formed. The polysilicon material is preferably completely removed in the emitter opening so that impurities can be diffused or implanted into the single crystal silicon base region to thereby form an intrinsic transistor base region. However, a common problem with such a technique is that the polysilicon etching process cannot be controlled accurately enough to assure that the single crystal silicon base material is not exposed to the etching process.

A problem associated with the foregoing transistor fabrication technique, and considered to be severe, is that of silicon crystal damage due to the plasma etch. The plasma etch down to the single crystal base region often causes silicon crystal damage and surface roughening at the location where the emitter-base junction is to be formed. The damage to silicon as a result of reactive ion etching is well known, as discussed in the technical article entitled "Reactive Ion-etching-induced Damage In Silicon Using $SF_6$ Gas Mixtures," J. Vac. Sci. Technol. B, Vol. 5, No. 4, Jul./Aug. 1987, pp. 876–882, and an article presented at the Fourth International Symposium on Semiconductor Processing, Jan. 1986, entitled "RIE Damage and its Control in Silicon Processing," pp. 163–172, by Fonash et al.

The etching of semiconductor circuit materials in general is often conducted by dry etch techniques employing plasma reactors. While plasma reactions are understood to a certain extent, a great deal of experimentation must yet be undertaken to develop suitable results when used in etch processes. This can be appreciated, as numerous different chemical and physical reactions take place in a plasma reaction. When considering the different chemical constituent elements employed in a plasma reaction, each of which react in many different ways to produce different results, the prediction as to the etching results are often unsatisfactory. The plasma etching of silicon semiconductor material has reached a stage such that a minimum knowledge and understanding has been gained in order to predict the results of the etching parameters for fabricating silicon circuits. Because silicon is the basic semiconductor material employed in fabricating semiconductor circuits, the focus on plasma etch developments has been directed to such material. Few, if any, development efforts have been undertaken in applying dry etch techniques to other semiconductor materials, such as germanium. This is due primarily to the fact that when germanium was widely utilized for fabricating semiconductor circuits and devices, plasma etching was unknown.

It is recognized today that the gases introduced into plasma reactors to provide the etching reactants readily react with silicon material and thereby etch polysilicon at essentially the same rate as that of the single crystal silicon material. Halogen gases are frequently utilized in plasma reactions to etch silicon. The halogen family of gases readily form volatile products with silicon, wherein the reaction by-products can be easily removed by exhausting the by-product gases.

While doping the polysilicon at impurity levels different than that of the single crystal material provides a certain degree of etch selectivity therebetween, even extreme doping level differences between the materials have not proven to provide a satisfactory etch rate difference. Current dry etch techniques have achieved at most an etch rate difference of 1:1.5 between silicon and polysilicon by utilizing different doping levels of the materials.

From the foregoing, it can be seen that a need exists for an improved dry etch technique which enables new semiconductor and non-homogeneous layers of materials in semiconductor circuits to be selectively etched. An additional need exists for a dry etch process which can quickly etch a material layer overlying the single crystal silicon material, but react with the underlying single crystal silicon material at a much lower rate, thereby reducing the exposure time of the base silicon material to the plasma process. There is yet another need for a dry etch chemistry which is adapted for etching a germanium interface layer more quickly than an underlying single crystal silicon base material.

SUMMARY OF THE INVENTION

In accordance with the invention, a dry etch process is disclosed which overcomes the disadvantages and shortcomings of the techniques heretofore known. The plasma etching technique of the invention employs a halogen liberating gas to expedite the etching of an interface material layer overlying the single crystal semiconductor base material, thereby removing the base material at a much slower rate once such base material is exposed to the chemical etch ingredients.

The etch chemistry employed according to the invention reacts differently as between a germanium interface material and an underlying single crystal silicon material. It is believed that such an etching gas forms a passivating layer on the single crystal silicon material for retarding the etching thereof, while providing no such passivating properties to the interface material, thereby allowing the composite non-homogeneous layered structure to be preferentially etched.

In the preferred form of the invention, a selective etch rate ratio is achieved between a germanium interface layer and a silicon base material by utilizing a halogen liberating gas comprising carbon tetrafluoride to achieve an etch rate ratio greater than 1.5. With such an etch rate which is selective between the materials, dry etch processes can be optimized to remove material layers underlying the silicon base material, and any timed overetch thereof thereby substantially minimizes the etch exposure time of the underlying silicon.

Fluorine-based etchants readily react with germanium atoms from the germanium interface layer, but a passivating layer on the underlying silicon base material is formed. The passivation surface layer on the silicon material is believed to comprise a macroscopic-scale polymer film which prevents either further fluorine atom reactions with the silicon base material, or molecular-scale reaction with surface reactive sites, by the partially fragmented parent, halogen-liberating species, such as $CF_x$ or $NF_x$ or $CCl_x$. The reactivity of the partially dissociated parent molecules is different for the two surface films involved, thereby producing a lower etch rate for the more reactive surface, again, by molecular-scale reaction with surface reactive sites which, with greater buildup, leads to macroscopic polymer film, both passivating the surface of interest with respect to the reaction involving an atomic halogen species.

In yet another embodiment of the invention, disclosed is a technique for detecting the progress of etching by depositing a nonsilicon layer of material over the single crystal silicon base material, and detecting the emergence of the single crystal silicon material in the reaction chamber by-product species once the interface material has been removed. A thin germanium interface layer is formed over the silicon base material, and is patterned to define the appropriate geometries. The wafer is then subjected to a plasma etch, irrespective of its selectivity between the materials. However, a silicon end point detector is utilized to monitor the etched by-products within the reaction chamber to signal the diminishing germanium by-products and/or the emergence of silicon etched by-products. At such point, it is assured that the interface layer has been completely removed and thus the etching process can be halted. Again, the integrity, quality and thickness of the silicon base material is optimized, thereby improving the quality and performance of the resulting integrated circuits.

BRIEF DESCRIPTION OF THE DRAWINGS

Further features and advantages will become more apparent from the following and more particular description of the preferred and other embodiments of the invention, as illustrated in the accompanying drawings in which like reference characters generally refer to the same parts or functions throughout the views, and in which:

FIGS. 4 and 5 are illustrations of silicon semiconductor surfaces showing respectively molecular and macroscopic surface passivation.

DETAILED DESCRIPTION OF THE INVENTION

Figure 1:
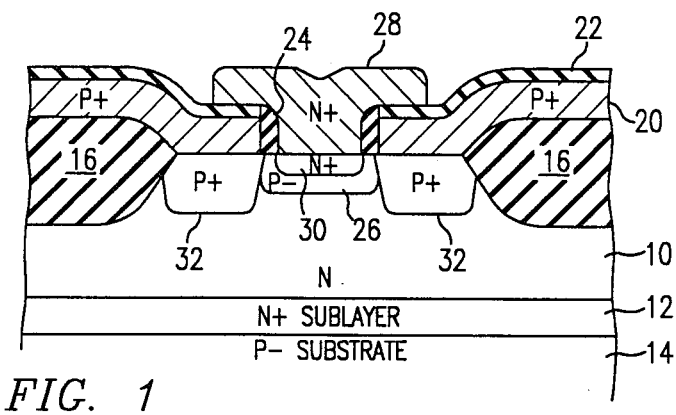
FIG. 1 illustrates a semiconductor structure constructed in accordance with the preferred embodiment of the invention.

FIG. 1 illustrates a semiconductor circuit fabrication employing the techniques of the present invention. Illustrated is a vertical bipolar transistor formed in a single crystal silicon material 10. The single crystal silicon 10 is formed as an N-type epitaxial layer overlying a heavily doped sublayer 12 which provides a low resistance transistor collector region. The semiconductor region 10 also functions as a transistor collector region. Both the single crystal silicon material 10 and the sublayer 12 overlie a P-type substrate 14.

A thick field oxide 16 is thermally grown or otherwise deposited on the wafer to provide lateral electrical isolation between similar bipolar transistors. Next, a germanium interface layer 20 is deposited over the wafer, to a depth of about 5,000 angstroms. In the preferred embodiment, the interface layer 20 comprises polycrystalline germanium. The germanium interface layer 20 is in intimate contact with the underlying single crystal silicon layer 10. Deposited over the interface layer 20 is an insulating layer of silicon oxide 22, serving to electrically isolate the first level of polygermanium 20 from a second level of polysilicon which is deposited in a subsequent step.

The wafer is then masked and patterned to define an opening through the insulating layer 22 and the germanium interface layer 20, down to the single crystal silicon layer 10. In etching through the germanium interface layer 20, it is important that little or none of the underlying material of the silicon layer 10 is removed, which otherwise could cause surface crystal damage. Such a result degrades various electrical characteristics of the transistor. As will be described in more detail below, the germanium interface layer 20 overlying the single crystal silicon layer 10 is selectively etched by dry etch techniques to substantially reduce or eliminate the possibility of crystal damage and surface roughening of the transistor base region.

Continuing with the fabrication of the bipolar transistor, a sidewall oxide 24 is formed for defining a spacer between the transistor emitter region and a transistor extrinsic base region. The spacer 24 is formed by depositing silicon oxide, such as TEOS, on the surface of the wafer, and etching the oxide in an anisotropic manner which leaves the sidewall oxide 24 as the remaining insulating material on the wafer. The wafer is subjected to an ion implant, in which P-type impurities are driven into the single crystal silicon material 10 to form a lightly doped transistor base region 26. Next, a conformal layer of polysilicon 28 is deposited over the wafer and patterned to define an emitter electrode and conductor. The polysilicon layer 28 is heavily doped with an N-type impurity, both for purposes of conductivity as well as to provide a source of impurities for forming the emitter region 30. The wafer is annealed or otherwise heat-treated during the fabrication process to drive the N-type impurities from the emitter conductor 28 down into the single crystal silicon base region 26, thereby forming an N-type emitter 30. The P-type transistor base material underlying the emitter 30 defines an intrinsic base region where bipolar transistor action occurs. During the heat-treating of the wafer, the P-type impurities from the polygermanium layer 20 are driven downwardly into the single crystal silicon material 10, thus forming an extrinsic P-type base regions 32. The first level polygermanium 20 is thereby in electrical contact with the extrinsic base regions 32. The wafer may then be masked and patterned for the formation of a base contact (not shown) to the polygermanium interface layer 20 which is electrically connected to the extrinsic base region 32.

The foregoing sets forth an application in which the dry etching technique of the invention may be advantageously practiced. However, it is to be understood that the invention may be employed in applications other than the formation of bipolar transistors, such as in the formation of NMOS, PMOS, CMOS circuits, as well as in the integration of bipolar and MOS-type circuits. In addition, with the disclosure of the invention as set forth below, those skilled in the art may readily be able to apply the principles and concepts to the selective etching of bilayers other than germanium and silicon.

Germanium has been used as a semiconductor material prior to the advent of dry etch processing when pattern diffusion was accomplished by wet etching. There is a manifest lack of documentation and teaching in the prior art of dry etching germanium. The invention disclosed herein makes possible the adaption of germanium for use with silicon circuits and with silicon processing equipment. Because plasma processing is an extremely complex science, involving literally over 100 reactions that are influenced by at least 10–20 variables, it is extremely difficult, if not impossible by someone experienced in the art, to priori predict the etchability of germanium by halogen-containing precursors in a glow discharge plasma. For example, even though it may be known that a product forms a volatile halide, such factor alone does not ensure that it can be etched, since the volatile halide product may, upon entering the plasma, be dissociated and redeposit another etch inhibiting product, as does $W(CO)_6$, thereby inhibiting or preventing further etching of the material.

Figure 2:
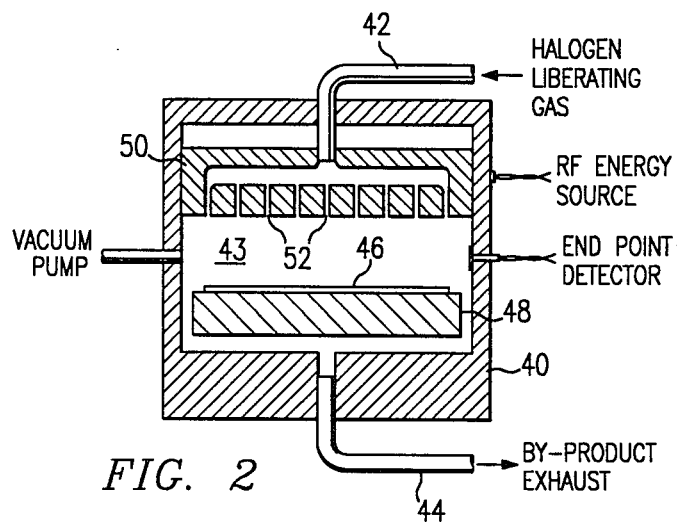
FIG. 2 illustrates the general construction of a dry etch reactor employed to carry out the methods of the invention.

FIG. 2 illustrates the major components of a conventional single-wafer plasma reactor which is well adapted for carrying out the dry etching of materials commonly employed in fabricating semiconductor circuits. The reactor includes an enclosure 40 for housing the plasma forming apparatus. The enclosure housing 40 includes an inlet 42 by which gas reactants are introduced into the reaction chamber 43, and an outlet 44 from which volatile etching by-products are removed. A processed semiconductor wafer 46, which may have previously undergone deposition, ion implant, diffusion, masking and patterning steps, is supported by an electrode 48 which may be grounded or otherwise connected to an RF energy source, depending on the particular type of reactor. An apertured plate or shower head apparatus 50 is connected to the gas inlet 42 and serves to distribute the gas reactants through apertures 52 and uniformly over the surface of the wafer 46. The RF energy source may be connected to the shower head apparatus 50 for providing the energy necessary to ignite and sustain a plasma between the shower head apertures 52 and the semiconductor wafer 46. Depending upon the gas reactants introduced into the plasma reaction chamber 43, silicon material can be uniformly etched at a known rate. However, and as noted above, polycrystalline silicon nd single crystal silicon material etch rates are very similar, and thus there is no significant selectivity as to the rate of removal of each such material. Accordingly, if in FIG. 1 the first level of material 20 were polysilicon, as is the typical case, it would be difficult to stop the emitter opening etch when the single crystal silicon material 10 is reached.

Figure 3:
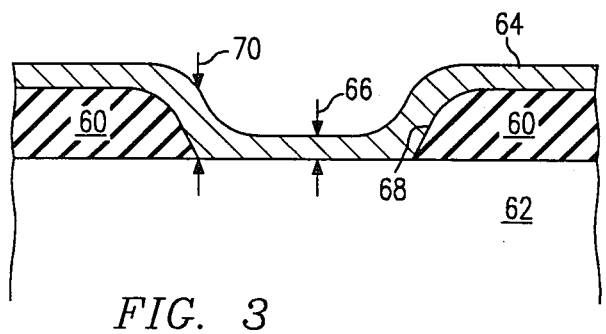
FIG. 3 is a sectional view of a semiconductor structure illustrating an application of the invention.

In the preferred form of the invention, a halogen liberating gas is introduced into the reaction chamber inlet 42 and allowed to react with the plasma to cause the removal of the surface materials which are responsive to reactants of the plasma. An important technical advantage of the invention is that by achieving a diverse etch ratio between two materials of a bilayer on the semiconductor wafer 46, the surface irregularities or topographical nature of a top material layer is not repeated as a surface irregularity in an underlying different material layer. This is shown in FIG. 3 where a patterned silicon oxide 60 is formed on a semiconductor base material 62. The top layer 64 of a different material, such as germanium, is deposited over the surface of the silicon wafer to a nominal depth of 500 angstroms. The general depth of the germanium layer is illustrated as reference character 66. However, in depositing conformal materials over surface irregularities, such as the edges 68 of the silicon oxide 60, the depth of the interface layer is different than the nominal depth 66. As noted, the depth of the interface layer 64 at location 70 is substantially greater, thereby requiring an extended etch time for removal thereof. During extended etching times which are required to remove all of the material of layer 64, the interface layer at location 66 is completely removed, and the plasma reactants begin to react with the underlying silicon base material 62, thereby also removing it. In accordance with an important feature of the invention, the interface layer 64 is selected to be a different material than that of the underlying material 62 and etchable at a different rate. An etch chemistry is selected which etches the interface layer 64 at a much higher rate than the underlying material 62. In the noted or other applications, the interface and base materials may be different than the noted germanium and silicon materials. In addition, those skilled in the art may select etch chemistries other than those identified below for selectively etching such different materials with diverse etch ratios.

Notwithstanding the non-uniformities acquired by the interface material 64 when deposited on an uneven surface topography, the invention is advantageously utilized when no such surface irregularities exists. In such a case, the interface layer material 64 can be quickly removed, and if the plasma reaction is not immediately halted, little or no overetch of the underlying base material 62 occurs, since such material is etched at a much slower rate. Accordingly, surface degradation and thinning of the material 62 is significantly reduced.

In the preferred form of the invention, the halogen liberating gas introduced into the plasma reaction chamber 43 comprises carbon tetrafluoride ($CF_4$). The interface layer 20 (FIG. 1) comprises germanium doped with a P-type impurity. The spacing between the wafer 46 (FIG. 2) and the shower head 50 was set to about 1.5 inch. The power applied to the plasma reactor was RF energy operating at a frequency of about 13.56 MHz, with about 175 watts. The wafer temperature was held at about 15° C., and the reaction chamber was evacuated to a pressure of about 1.5 torr. The flow rate of the halogen liberating gas was maintained at about 60 sccm.

Under such conditions, the etch rate of the germanium interface material was measured to be about 3,774 angstroms per minute, while the silicon etch rate was measured at about 451 angstroms per minute. The Ge:Si etch rate ratio therefore is about 8.3, meaning that the germanium was etched at rate of about eight times faster than that of the silicon material.

As a further experimental example, a germanium interface layer and a silicon base material were subjected to the $CF_4$ halogen liberating gas under the same conditions, except the RF energy was reduced to 150 watts, the reaction chamber pressure was increased to 1.75 torr and the gas flow rate was reduced to 45 sccm. As a result, the germanium etch rate was measured to be 2412 angstroms per minute while the silicon etch rate was measured to be 424 angstroms per minute. The resulting Ge:Si etch rate ratio is about 5.7, indicating that under such conditions the germanium material is etched at a rate of about six times faster than the silicon base material.

In yet another experimental example utilizing carbon tetrafluoride as the halogen liberating source, the selective etch process was carried out under the same conditions as noted in example two above, with the exception that the pressure in the reaction chamber 43 was reduced to 1.5 torr. Under such conditions, the germanium etch rate was measured at 2117 angstroms per minute, while the silicon etch rate was measured at 457 angstroms per minute. The resulting Ge:Si etch rate ratio is about 4.6.

It is believed that as between example two and example three, the higher etch rate realized as a result of the minor decrease in reaction chamber pressure is related to the higher gas pressure. There is believed to be a correspondingly higher gas and surface phase collision of partially dissociated parent molecules, e.g. $CF_x$, which tends to expedite polymerization of the surface of the silicon material 10. It can be appreciated that an etch rate ratio change of greater than unity was realized between examples two and three above with the minor increase in the pressure of the plasma reaction chamber of only about 0.25 torr. During the plasma reaction with carbon tetrafluoride, the fluorine atoms are liberated and thus made available for atomically reacting with the surface material of the wafer 46. To that end, the halogen family of gases is well adapted for use as etchants as they readily form a volatile product with silicon and other semiconductor materials. The germanium tetrafluoride gas has a high volatility, and has sufficient stability such that once liberated from the surface and immersed into the energetic plasma, it does not readily dissociate and redeposit on the very surface from which it originally emanated. Thus, upon reaction with fluorine atoms, the germanium atoms are allowed to be readily removed from the surface of the interface layer 20. Such dislodged germanium atoms define by-products which are removed from the reaction chamber via exhaust outlet 44.

The etch rate ratio results noted in the foregoing examples are believed to be due to the ability of the fluorocarbon molecular radicals, e.g. $CF_x$, which are generated from dissociation of the $CF_4$ gas, to polymerize the surface of the single crystal silicon 10 of the base material and thereby form a passivating cover layer. The passivating layer inhibits further atomic reactions between the free fluorine atoms and the silicon atoms underlying the passivating layer, thereby significantly reducing the etching reaction with the remaining silicon material. In addition, it is hypothesized that the $CF_x$ molecule resulting from the carbon tetrafluoride gas has a higher sticking coefficient such that it readily adheres to the silicon surface and thereby forms the passivation layer. In contrast, the molecular sticking coefficient with respect to germanium may be significantly less, and thus the germanium surface remains essentially virgin and is therefore readily reactable with the free fluorine atoms.

The passivation of the silicon surface can occur on two levels: microscopically and macroscopically. As shown in FIG. 4, when a molecular species reacts and "ties up" a reactive site on a surface, microscopic "poisoning" or passivation is effected. Shown is a silicon substrate 72 with a surface 74 which is exposed to a fluoride-based plasma etch process. More particularly, the surface 74 of the silicon 72 is characterized as having reactive surface sites 76, referred to as dangling bonds. Carbon 78 and fluorine 80 atoms form a molecular passivation layer and function as a reactive and steric hindrance to further reactions with the germanium surface by free fluorine atoms in the plasma reaction chamber. However, and as shown in FIG. 4, the surface density of the molecular passivants is not sufficient to result in bonding between the molecular passivants, themselves; hence, polymerization is largely not manifest on the surface. This is in sharp contrast with that shown in FIG. 5 where the surface density of the molecular passivants is sufficiently high to result in polymerization where bonding between the carbon atoms is established. The fluorine atoms 80 are shown as having a characteristic partial negative charge and thereby tie up or poison the surface 74 of the silicon substrate 72. Chemistries can also be selected for operating on the same principle with a germanium surface. If the molecular species achieve a sufficient level of surface concentration and are reactive with each other, bulk polymerization or agglomeration occurs and results in macroscopic passivation of the surface.

Macroscopic passivation is shown in FIG. 5. The bulk silicon 82 is again characterized as having silicon surface sites 84 forming adducts or weak bonds 86 with the $CF_x$ polymer, and in particular $CF_2$ polymer constituents 88 are each bonded together, and to each silicon surface site 84 to form a macroscopic polymer passivation layer. While not shown, one or more similar polymer layers may form over the layer shown to define a multiple layer $(CF_2)_n$ passivation cover on the silicon surface. Moreover, it is possible that the passivation layer, once formed, will have an even higher sticking coefficient than the original silicon surface, further enhancing etch selectivity between the germanium and silicon surfaces.

Once again, the key to both passivation mechanisms depends on the relative sticking coefficients of the particular molecular species with respect to the two surfaces involved. This mechanism of microscopic/macroscopic passivation premised on disparate sticking coefficients for a particular molecular species relative to different surfaces, can be generalized to any combination of surfaces where the above mechanisms are manifest. The foregoing applies in instances where the surfaces layers are either layered on top of each other, or where the surfaces are simultaneously exposed, i.e., laterally adjacent each other. The macroscopic polymerization of the bottom layer of the bilayer can be augmented by introducing a hydrogen gas, or other hydrogen rich constituent, into the reaction chamber 43. As an example, a hydrogen containing species such as $CHF_3$ can be introduced into the reaction chamber together with the halogen liberating gas.

An important technical advantage of the invention is that material bilayer can be selectively etched according to the invention, by using dissociated products of certain halogen liberating gases which exhibit a high sticking coefficient of the constituent radicals thereof, to form the noted passivating layer, either on a molecular or macroscopic scale. In other words, the materials of the bilayers are selected, when possible, together with certain halogen liberating gases such that one layer of the bilayer is highly receptive to the formation of surface passivation, while the other layer of the bilayer is much less receptive. In contrast with prior macroscopic polymerization practices, the present invention operates on a microscopic basis. To that end, the molecular radicals such as $CF_x$ employed in the etching reactants of the invention tie up the free surface sites of the silicon material so as to passivate the underlying bulk silicon material with respect to reaction with the atomic halogen, for example. Essentially, a monomolecular layer of molecular radicals is formed on the silicon surface thereof, thereby tying up singular atomic sites and preventing reaction of the plasma gases with the underlying bulk silicon. As a result, the etching of the silicon is greatly retarded, as compared to the germanium layer of the composite bilayer which germanium layer exhibits a much lower surface reactivity toward the molecular radicals, resulting in a lower sticking coefficient.

A suitable diverse etch rate ratio between germanium and silicon may also be obtain by utilizing sulfur hexafluoride ($SF_6$) as the halogen liberating fluid. In one experimental example, the $SF_6$ gas was introduced into a plasma reaction chamber 43 having a one inch plate spacing and a 13.56 MHz RF energy source operating at 75 watts. The substrate temperature was maintained at 15° C., and the reaction chamber was evacuated to a pressure of 350 millitorr. The flow rate of the $SF_6$ gas was maintained at 50 sccm. As a result, the germanium etch rate was measured at 9118 angstroms per minute, while the silicon etch rate was measured at 4539 angstroms per minute, thereby resulting in a Ge:Si etch rate ratio of about 2.0. Again, in this example the atomic fluorine constitutes the particular halogen which reacts with the germanium material more readily than with the silicon material.

While the foregoing illustrates experimental results with a fluorine halogen, it is believed that other halogens would behave similarly, although perhaps not identically, and even though the volatilities thereof may be different from that of fluorine. Moreover, it is believed that appropriate alternative halogens can be selected for use with gallium arsenide semiconductor and other base materials, rather than the single crystal silicon material described above.

Illustrated below are a number of other halogen gas compositions and the associated melting and boiling points thereof, all which are believed to be employable in conjunction with the principles and concepts of the invention. It is to be understood that the noted list of halogen gases is not exhaustive as to those which are believed to be usable in selectively etching different material bilayers in the semiconductor fabrication environment.

| HALOGEN COMPOUND | MELTING POINT °C. | BOILING POINT °C. |
|---|---|---|
| $GeF_4$ | Sublimes at $-37$ | — |
| $GeBr_4$ | 26.1 | 187 |
| $GeCl_4$ | $-49$ | 84 |
| $SiBr_4$ | 5.4 | 154 |
| $SiCl_4$ | $-70$ | 58 |
| $SiF_4$ | $-90.2$ | $-86$ |

It would appear from the foregoing that because of the higher volatility of silicon fluoride ($SiF_4$) that it would etch faster than germanium fluorine ($GeF_4$) where the opposite is observed to be true.

In accordance with another feature of the invention, the plasma reactor is provided with an end point detector, as shown in FIG. 2. The end point detector essentially comprises a diode which is responsive to a predefined spectral wavelength which is unique to the species detected. As is well known, each material element is characterized by the emission of a different light wavelength when the electrons thereof are excited and move between different quantum energy levels. Therefore, when it is desired to detect a desired elemental species in the reactor chamber 43, it is necessary to utilize a selected diode which provides an increased diode current when subjected to the wavelength of light characteristic of the element to be detected. Such diodes are well known in the art, as are amplifiers and control circuits to control the plasma reaction when detecting a specific wavelength of light. According to the invention, a diode is utilized which is responsive to a silicon wavelength light when etching the germanium interface layer 20. Thus, when etching the top of the bilayer, the output of the diode will be minimum, but when the surface of the silicon layer 10 is reached, silicon will be etched and released in the plasma reactor chamber 43, whereupon the end point detector diode will generate an increased or maximum output. The control system, in the case of a computerized system, can then allow the system to continue etching for a predetermined overetch time, then stop.

From the foregoing, an end point detection system can be employed with the etching of homogeneous bilayers to detect the complete removal of one layer, without using the special purpose selective chemical etches described above. As an alternative, a germanium/silicon bilayer can be selectively etched using end point detectors which are responsive to the germanium elemental species. In such a case, the system would be programmed or otherwise constructed to sense the maximum response by the germanium light-sensitive diode, and respond to a minimum thereof when the germanium layer is removed by the plasma etch, indicating the underlying silicon material is beginning to be removed by the etch. The output of the end point detecting diode would thus transcend from a maximum response to a minimum response to indicate the progress of the etch through the germanium/silicon interface.

The end point detection feature of the invention can be utilized in fabricating semiconductor circuits which utilize first and second level polysilicons and a single crystal silicon substrate. In such a fabrication technique, which is conventional, a thin germanium layer can be deposited between the single crystal substrate silicon and the first level polysilicon. In etching through the polysilicon and germanium layers, the end point detector can be constructed to respond to minima or maxima as the etch proceeds through the interface between the germanium and the single crystal silicon. It can be appreciated that such an end point detection scheme can be used with homogeneous bilayers of materials different than those noted above.

The reactive ion etch (RIE) mode, whether employing either powered anode or cathode, can be utilized with a halogen liberating gas source to achieve the selective etching between different material bilayers. In addition, an MIE reactor mode utilizing a magnet to impart a spin to the halogen ions to enhance ionization, may be utilized in accordance with the invention. The microwave afterglow process which disassociates atomic structures is believed to be operable with a halogen liberating source for selectively etching one material with respect to another material to achieve different etch rates. In general, the invention described herein can be effectively used to achieve the desired result of differential etch rates for two materials with plasma etch equipment, the above being examples of such equipment.

While the preferred embodiment of the invention has been disclosed with reference to specific structures, reactants and operations, it is to be understood that many changes in detail may be made as a matter of engineering choices without departing from the spirit and scope of the invention, as defined by the appended claims.

What is claimed is:

1. A method for etching semiconductor materials employed in fabricating semiconductor circuits, comprising the steps of:
   forming a pair of semiconductor material films having a first film of semiconductor material and second film of a different semiconductor material; and
   selectively etching said first film with an etch process which etches said first film faster than said second film so that when said first film is removed, the second film is removed at a slower rate.

2. The method of claim 1, further including etching said first film using a dry etch process.

3. The method of claim 2, further including etching said first film by employing a plasma etch process.

4. The method of claim 1, wherein said second film comprises silicon, and said first film comprises germanium.

5. The method of claim 4, further including etching said germanium using a plasma process with a halogen liberating gas source.

6. The method of claim 4, further including etching said first film with carbon tetrafluoride.

7. The method of claim 4, further including etching said first film with sulfur hexafluoride.

8. The method of claim 1, wherein said etch is adapted to etch said first film at a rate of at least 1.5 times greater than the rate by which said second film is etchable.

9. The method of claim 1, further including etching said first film with a gas which is adapted for forming a passivation layer on said second film so that said second film is etched at a different rate than that of said first film.

10. The method of claim 9, further including employing a plasma reacting gas which forms a monomolecular passivating layer on said second film.

11. The method of claim 9, further including using a plasma reacting gas which produces molecular radicals having a higher sticking coefficient with the second film relative to the first film to passivate on a molecular scale the second film to reduce the etch rate thereof.

12. The method of claim 9, further including employing a plasma reacting gas which produces a high concentration of molecular radicals that have a high sticking coefficient and a high surface concentration on the second film so as to form polymers or agglomerate macroscopically and thereby form said passivation layer.

13. The method of claim 1, further including using an end point detector for detecting when the first film is removed and when said second film is exposed to the etchants of the etching process.

14. The method of claim 1, further including forming a bilayer of said first and second films.

15. The method of claim 1, further including forming said first film and said second film as laterally situated layers.

16. A method for etching semiconductor materials employed in fabricating semiconductor circuits, comprising the steps of:
   forming a material bilayer having a top layer of semiconductor material disposed on a base layer of a different semiconductor material; and
   etching said top layer of material with a plasma process using a halogen liberating gas source such that said top layer is etched at a rate faster than said base layer.

17. The method of claim 16, further including forming said bilayer with a germanium material formed over a silicon base material.

18. The method of claim 16, further including employing a fluorine-based liberating gas source in said etching process.

19. The method of claim 18, further including employing sulfur hexafluoride.

20. The method of claim 18, further including employing carbon tetrafluoride as said halogen liberating gas.

21. A method for etching materials employed in fabricating semiconductor circuits, comprising the steps of:
   forming a material bilayer having a top layer of material disposed on a base layer of a different material; and
   etching said top layer material with a dry etch which etches said top layer and which forms a passivating layer on said base layer so that said top layer is etched substantially faster than said base layer.

22. The method of claim 21, wherein said dry etch is carried out by employing a plasma process.

23. The method of claim 22, further including employing a halogen liberating gas and a plasma reaction.

24. The method of claim 23, further including employing carbon tetrafluoride as said halogen liberating gas.

25. The method of claim 23, further including employing sulfur hexafluoride as said halogen liberating gas.

26. The method of claim 21, further including employing a halogen liberating source to form a polymer passivating layer on said base layer.

27. The method of claim 21, further including forming said top layer with germanium and forming said base layer with silicon.

28. The method of claim 21, further including forming a monomolecular passivating layer on a top surface of said base layer.

29. A method for etching materials employed in fabricating semiconductor circuits, comprising the steps of:
    forming a material bilayer having a top layer material disposed on a base layer of a different material;
    plasma etching said top layer;
    sampling plasma reaction by-products to detect when said base layer is exposed to the plasma reaction; and
    halting said plasma reaction when said base material is detected in said sample.

30. The method of claim 29, further including forming a germanium top layer over said base layer.

31. The method of claim 30, further including detecting a germanium species in the etched by-product, and then detecting a minimum germanium by-product and as a result thereof halting the etching process.

32. The method of claim 29, further including carrying out said etching process with a selective etch which etches the top layer faster than the base layer.

33. A method for etching a semiconductor material, comprising the steps of:
    selecting a dry etch chemistry having a halogen liberating property;
    igniting a plasma reaction in the presence of said dry etch chemistry; and subjecting the semiconductor directly to plasma ions and electrons produced by said plasma reaction.

34. The method of claim 33, further including selecting an etch chemistry which liberates fluorine atoms during the plasma etch process.

35. The method of claim 33, further including selecting etch chemistry reactants which form a macroscopic passivation layer on said germanium.

36. The method of claim 33, further including forming a non-homogeneous bilayer of material, one said layer being said germanium, and selecting an etch chemistry which etches the materials of said bilayer with diverse etch rates.

37. The method of claim 36, further including selecting an etch chemistry which etches the germanium substantially faster than said other material of said bilayer.

38. The method of claim 37, further including forming said bilayer using silicon as one material layer.

39. The method of claim 33, further including etching said germanium at a rate of at least 3,000 angstroms per minute.

40. The method of claim 39, further including etching said germanium using a carbon tetrafluoride chemistry.

41. The method of claim 40, further including etching said germanium using about 175 watts of RF energy and a reaction chamber pressure of about 1.5 torr.

* * * * *